United States Patent [19]

Lippits et al.

[11] 4,085,285

[45] Apr. 18, 1978

[54] METHOD OF MANUFACTURING PRINTED CIRCUIT BOARDS

[75] Inventors: Gerardus Johannes Meinardus Lippits; Petrus Johannes Janssen; Henricus Antonius Debruijn; Johannes van Ruler, all of Eindhoven, Netherlands

[73] Assignee: U.S. Philips Corporation, New York, N.Y.

[21] Appl. No.: 712,162

[22] Filed: Aug. 6, 1976

Related U.S. Application Data

[63] Continuation of Ser. No. 527,045, Nov. 25, 1974, abandoned.

[30] Foreign Application Priority Data

Nov. 29, 1973 Netherlands .................... 7316313

[51] Int. Cl.$^2$ ............................................. H05K 3/18
[52] U.S. Cl. ................................... 174/68.5; 427/53; 427/97; 427/98; 96/36.2
[58] Field of Search .................. 96/36.2; 427/96, 97, 427/372, 53, 98; 174/68.5

[56] References Cited

U.S. PATENT DOCUMENTS

| 3,380,823 | 4/1968 | Gold | 96/48 R |
|---|---|---|---|
| 3,485,658 | 12/1969 | Iler | 427/379 |
| 3,616,294 | 10/1971 | Kheighatin | 156/2 |
| 3,627,576 | 12/1971 | Knorre | 156/2 |
| 3,674,485 | 7/1972 | Jonker | 96/36.2 |
| 3,758,304 | 9/1973 | Janssen | 96/36.2 |

FOREIGN PATENT DOCUMENTS

1,209,963 10/1970 United Kingdom .................. 96/36.2

*Primary Examiner*—Ralph S. Kendall
*Attorney, Agent, or Firm*—Frank R. Trifari; Norman N. Spain

[57] ABSTRACT

Manufacture of photosensitive material by a dispersion of particles of semiconducting metal oxide having a charge sign opposite to that of the substrate in the dispersion agent, which dispersion is provided on the substrate surface and adhered thereto. In a similar manner walls of a hole for electrical through-connections are made photosensitive as a pretreatment for metal-plating.

6 Claims, No Drawings

METHOD OF MANUFACTURING PRINTED CIRCUIT BOARDS

This is a continuation of application Ser. No. 527,045 filed Nov. 25, 1974, now abandoned.

The invention relates to a method of manufacturing photosensitive material for obtaining an external electrically conducting metal pattern on a non-conducting hydrophobic support, to the photosensitive material thus obtained and the the final product obtained therewith.

A method of photographically manufacturing electrically conducting metal patterns is known from the U.K. patent specification No. 1,229,935 in which a photosensitive material is used consisting of a hydrophobic support bearing a coating of a resinous binder in which solid finely dispersed particles of a photosensitive semiconducting oxide are homogeneously distributed, while the light reaction product of said photosensitive semiconducting oxide is capable of separating copper and/or a metal nobler than copper from a solution of the relevant metal salt.

A drawback of this method is that the ascessibility of the photosensitive material for the aqueous baths is poor so that high concentrations of photosensitive material and nuclei-forming agents must be used.

According to U.K. patent specification No. 1,338,435 this has been improved by subjecting the resin with the photosensitive compound dispersed therein to a controlled superficial attack of the resin in such a manner that due to the attack a thickness of between approximately 0.1 and 1 μm of the coating is etched off. A drawback of the use of this material is the limitation of the resolving power by light scattering on the dispersed particles on the surface and by roughening of the surface. A further drawback of this method is that the steps to obtain the photosensitive starting material are rather time-consuming.

The method according to the invention provides in a fairly simple manner photosensitive material with a semiconducting oxide as a photosensitive compound which may serve as a starting material in an additive method of manufacturing printed circuit boards.

It is characterized in that the substrate material is contacted with a dispersion of particles of the photosensitive semiconducting metal oxide in a liquid not reacting therewith, which particles have a charge sign which is opposite to the charge sign of the substrate material on the surface in the dispersion agent, whereafter the excess is removed by rinsing and subsequently the product thus obtained is subjected to a thermal treatment at a temperature of more than 50° C but less than the softening point or the decomposition point of the substrate material for a period dependent on the temperature chosen.

It is to be noted that it is known from U.S. Pat. No. 3,485,658 that particles can be provided on substrate surfaces by means of colloidal solutions and that the charge condition of these surfaces has a decisive influence on the adhesion. A possible necessary reversal of the sign of charge may be brought about by adjusting the pH iwithin a defined range of pH values.

Based on this recognition a photosensitive coating having a thickness of one grain is provided. It is surprising that such a thin coating, which is even invisible with the naked eye, is sufficient for photosensitivity and that the adhesion of the metal patterns manufactured therewith is eminent.

Another aspect of the invention provides for the manufacture of two sided printed circuit boards with plated-through holes.

Different methods are known with which in a printed circuit board having a two-sided partern metallic through-connections can be made through a hole which may also serve as an electrical and mechanical point of connection of a supply wire of a component. In most methods a basic material is used accommodating homogeneously dispersed particles that can produce in some way or other nuclei for plating. During drilling or punching of the hole these particles are released at any arbitrary place in the panel on the walls. One possibility is the choice of particles which of themselves or after reduction are catalytic for electroless deposition of metal coatings; another possibility is the choice of a photosensitive semiconducting compound which after contact with a solution of a noble metal salt and exposure produces nuclei that can be plated. A further possibility is the choice of so-called redox polymers which upon contact with a solution of a noble metal ion reduce this ion to metal in the form of nuclei.

All these methods are based on special starting material which is rather expensive. Special difficulties occur when the basic material comprises filters, for example, for reinforcement such as glass fibre material in epoxy resin boards. Notably in the said case this often results in the dispersion degree of the particles that must produce the nuclei being irregular. Especially at the area of a glass fibre mat, which is often present in epoxy board material for the purpose of reinforcement, the concentration is so low that insufficient nuclei can be produced. The ultimately obtained copper coating in the holes thus exhibits interruptions at the area of the bare glass fibres so that this coating will be mechanically and electrically unreliable. In addition some of the fillers are hard to wet by the nuclei-forming liquids.

The method of maufacturing printed circuit boards having completly plated-through holes in a substrate material optionally provided with a filler is characterized in that prior to and/or subsequent to an exposure the walls of the holes are contacted with a dispersion of particles of a photosensitive semiconducting metal oxide as described above, which particles have a charge sign opposite to that of the previously mentioned filler and/or opposite to the charge sign of the substrate material on the surface in the dispersion agent, whereafter the excess is removed by rinsing and subsequently the product thus obtained is subjected to a thermal treatment at a temperature of more than 50° C but less than the softening point or the decomposition point of the substrate material for a period which is dependent on the temperature chosen.

In the manufacture of two-sides printed circuit boards with plated-through holes the photosensitive material obtained according to the first aspect of the invention is preferably used as a substrate material. It is alternatively possible to start from sheet material having pre-drilled holes and to manufacture in one operation the two-sided pattern with plated-through holes.

A practical embodiment of the invention is epoxy board material having a glass fibre reinforcement and a monograin layer of $TiO_2$ particles with a particle size of less that 0.5 μm provided thereon by means of a dispersion having a pH of between 1 and 6, preferably between 2 and 4 which after the provision of the pattern and drilling of the holes is wetted with a similar $TiO_2$ dispersion in the holes.

EXAMPLE

A glass plate of 5 × 5 sq.cm.is immersed in a colloidal solution of $TiO_2$ in $H_2O$ comprising 2 to 5% by weight of $TiO_2$ whose pH is adjusted at 3 with the aid of hydrochloric acid. The titanium dioxide is from the firm of Degussa, indication P25, and has a specific surface of 57 sq.m/g. The suspension-treated plate is rinsed in running water and dried whereafter the material is treated with a nuclei-forming solution comprising per liter.

2 g $PdCl_2$
20 ml 37% HCl
0.4% by weight of "Tensagex"
1% by weight of glycerine ("Tensagex DP 24", an nnion surface active material is a sodium salt of an alkylphenolpolyglycolethersulphate from the firm of Sapchim — Fournier — Cimag S.A., France). The glass plate is dried and exposed for 30 seconds at a distance of 30 cms behind a negative under a 125 W high pressure mercury lamp.

A palladium nuclei image is formed on the exposed areas. On the non-exposed areas the palladium ions are removed by rinsing for 1 minute in water whereafter the nuclei image is intensified in a chemical copper-plating solution of the following composition:

0.14 M $CuSO_4.5H_2O$
0.30 M tetrasodium salt of ethylenediaminetetra acetic acid
0.65 M NaOH
2.0 M formaldehyde for 2 minutes at a bath temperature of 25° C.

A copper pattern having an eminent adhesion to the glass is obtained.

When in the above described method $TiO_2$ is replaced by ZnO, of the firm of Hopkins and Williams, with a specific surface of 4 sq.m/g in a quanitity of 2% by weight in water (pH = 6.5) and is nucleated with a solution of 1.82 g/l $Pd(NH_3)_2(NO_2)_2$ in water (pH = 7.2) comparable results are obtained.

EXAMPLE 2

A plate consisting of monocrystalline yttrium-gadolinium-iron garnet is used as the support material of the photosensitive material while the colloidal solution comprises 2% by weight of $TiO_2$.

A copper pattern of eminent adhesion to this basic material is obtained in the same manner as in example 1.

EXAMPLE 3

A photosensitive coating is provided on a ceramic material substrate of the composition in % by weight: 80.4 $TiO_2$, 15.2 BaO and 4.4 $ZrO_2$ and nucleation is performed in the same manner as in example 1. The palladium nuclei image is intensified to a phosphorus-containing nickel coating having a thickness of 0.3 μm by immersing the plate for 3 minutes in a bath heated to 95° C and comprising per liter:

30 g $NiCl_2.6H_2O$
30 g aminoacetic acid
10 g $NaH_2PO_2.H_2O$ (pH 3.8).

A nickel pattern of eminent adhesion to the ceramic material plate is obtained.

EXAMPLE 4

A positive photoresist based on a carboxymethylether of a formaldehyde resin comprising o-chinondiazide as a sensitizer and marketed under the indication AZ 1350 H by the firm of Shipley is provided on plates having a surface of 5 × 5 sq. cm. consisting of $Al_2O_3$. The solution is evenly distributed over the surface by centrifuging for 1 minute at a speed of 1800 rpm. The plates are dried and exposed in a cassette behind a negative for 30 seconds at a distance of 30 cm with the aid of a 125 W high pressure mercury lamp while the negative is urged against the plates with the aid of compressed air.

Subsequently the plates are developed for 2 minutes in an aqueous alkaline solution available under the indication AZ developer from Shipley and diluted with equal parts by volume of water.

The photosensitive coating consisting of a 2% by weight solution of $TiO_2$ in water is provided by drawing the plates from this solution.

The excess of $TiO_2$ is rinsed off in running water so that a monolayer is left which is dried for 10 minutes at 70° C. The plate is immersed in a liquid comprising 50 mg $PdCl_2$
0.1 ml HCl per liter and evenly exposed in the liquid with a 125 W high pressure mercury lamp at a short distance for 30 seconds. The plate is thoroughly rinsed in water and intensified for 30 seconds in the Ni-bath mentioned in Example 3. After rinsing in water the photoresist which is still present is removed with the aid of Shipley AZ remover and/or acetone. The remaining NiP pattern is electroless intensified to the desired thickness by means of the bath described in Example 1 after a possible thermal treatment.

EXAMPLE 5

An epoxy glall fibre plate through-filled with $TiO_2$ and provided with holes is treated for 2 minutes in methylethylketone, subsequently dried and then roughened under application of vibration for 2.5 minutes at a bath temperature of 50° C in a solution comprising per liter:

120 g $Na_2CrO_7$
400 ml $H_2SO_4$ (96%)
200 ml $H_3PO_4$
400 ml $H_2O$.

Rinsing takes place in running water. Possible loose $TiO_2$ particles are removed by ultrasonic vibration in water whereafter the plate is rinsed again for 2 minutes in water and subsequently dried with compressed air.

$TiO_2$ particles are then provided in the holes with the aid of a colloidal solution comprising 1-5% by weight of $TiO_2$ and having a pH of 2-3 which is adjusted with hydrochloric acid or nitric acid. By thoroughly rinsing in water the excess of $TiO_2$ is removed whereafter drying takes place for 10 minutes at a temperature of 120° C; the plate is once more rinsed in water for 4 minutes of which 2 minutes comprise ultrasonic rinsing and drying with compressed air. The epoxy glass fibre plate is treated with a nuclei forming solution comprising per liter the following constituents:

2 g $PdCl_2$
20 ml concentrated HCl ($d$ = 1.19)
0.2% by weight of "Lissapol N"
1% by weight of glycerine ("Lissapol N" is a non-ionic surface active compound having the structure of nonylphenolpolyoxyethylene, from the firm of I.C.I.).

Drying is effected with the aid of compressed air whereafter the plate is exposed for 2 minutes in a vacuum cassette under a 125 W HPR lamp behind a stencil so that a palladium nuclei image is produced on the exposed areas of the epoxy glass fibre plate.

The palladium ions are removed on the non-exposed areas by rinsing the material for 2 minutes in water. In order to mask possibly left palladium ions the epoxy glass fibre plate is treated with a 0.4 M glycerine solution, pH = 4 for 2 minutes at a temperature of 70° C.

Before intensifying the nuclei image the material is rinsed in water for 2 minutes whereafter it is introduced into a chemical copper-plating bath whose composition has already been given in example 1. In order to intensity the conducting copper pattern to a total thickness of 35 μm a chemical copper-plating bath of the following composition is used:

0.028 mol/l copper sulphate (5 H$_2$O)

0.030 mol/l tetra Na salt of ethylenediaminetetraacetic acid 0.010 mol/l sodium hydroxide 0.13 mol/l formaldehyde 19 mol/l "Carbowax 4000", i.e. a polyethylene glycol having a molecular weight of approximately 4000 from the firm of Union Carbide Chem. Corporation) having a bath temperature of 50° C.

To improve the adhesion of the copper pattern a temperature treatment of 120° C follows for 2 hours. An adhesion of 180 g/mm is measured.

EXAMPLE 6.

The method mentioned in Example 5 is not performed on the epoxy glass fibre plate through-filled with TiO$_2$ but on an epoxy glass fibre material not filled with TiO$_2$. The photosensitive compound is provided after roughening as described in the previous example. This is done by immersion in the colloidal TiO$_2$ solution of Example 5 so that not only the holes but also both surfaces are provided with TiO$_2$. When furthermore the method of Example 5 is followed a copper pattern having tracks with an adhesion of 180 g/mm to the basic material is obtained.

What is claimed is:

1. A method of forming completely metallized holes in printed circuit boards, said method comprising providing the desired holes in a substrate, contacting the walls of said substrate with an aqueous dispersion of TiO$_2$ particles, the charge sign of said TiO$_2$ particles in the dispersion being opposite to that at the walls of said holes while in contact with said dispersion, rinsing away any excess of said dispersion from the walls of said holes, subjecting the thus treated walls to a thermal treatment at a temperature of more than 50° C but less than the softening temperature or decomposition temperature of the material of said walls, the resultant walls being coated with a layer of TiO$_2$ particles one grain thick, treating the resultant TiO$_2$ coated walls of said holes with a solution of a metal salt capable of being reduced to metal nuclei by TiO$_2$ particles when exposed to actinic light, exposing the walls of said holes to actinic light thereby causing the walls of said holes to be coated with a metal nuclei layer and then subjecting said metal nuclei layer to the action of a solution of a metal compound capable of being chemically deposited on said metal nuclei layer in its metallic state to thereby increase the amount of metal on the walls of said holes.

2. The method of claim 2 wherein the substrate is provided with a filler having a charge sign opposite that of the TiO$_2$ particles.

3. The method of claim 2 wherein the substrate is an epoxy sheet material reinforced with glass fibers coated with a monograin coating of TiO$_2$ particles of a particle size of less than 0.5 μ and the dispersion of TiO$_2$ particles employed has a pH of between 1 and 6.

4. The method of claim 3 wherein the pH of the dispersion is between 2 and 4.

5. The method of claim 4 wherein the holes are drilled after a pattern has been formed on the substrate and then the walls of the holes are treated with the aqueous dispersion of the TiO$_2$ particles, exposed to actinic light, provided with metal nuclei and then metal plated.

6. A printed circuit board having plated-through holes manufactured by the method of claim 1.

* * * * *